(12) United States Patent
Lee et al.

(10) Patent No.: US 6,479,895 B1
(45) Date of Patent: Nov. 12, 2002

(54) HIGH PERFORMANCE AIR COOLED HEAT SINKS USED IN HIGH DENSITY PACKAGING APPLICATIONS

(75) Inventors: Seri Lee, Beaverton, OR (US); Lloyd L. Pollard, II, Portland, OR (US); Craig M. Randleman, Firecrest, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/860,978

(22) Filed: May 18, 2001

(51) Int. Cl.⁷ .............................................. H01L 23/34
(52) U.S. Cl. ...................... 257/720; 257/706; 361/704; 361/709; 361/697
(58) Field of Search .......................... 257/720; 361/697, 361/704, 709

(56) References Cited

U.S. PATENT DOCUMENTS

| | | | |
|---|---|---|---|
| 3,182,114 A | 5/1965 | Burgess et al. ............... 174/15 |
| 3,187,082 A | 6/1965 | Allison ......................... 174/35 |
| 3,239,003 A | 3/1966 | Boudette et al. ............. 165/185 |
| 4,557,225 A | 12/1985 | Sagues et al. ............. 123/41.31 |
| 5,132,875 A | 7/1992 | Plesinger ..................... 361/386 |
| 5,375,652 A | 12/1994 | Matsunaga et al. ........ 165/80.3 |
| 5,437,327 A | 8/1995 | Chiou ......................... 165/122 |
| 5,567,983 A | 10/1996 | Hirano et al. ............... 257/722 |
| 5,597,034 A | 1/1997 | Barker, III et al. ........ 165/80.3 |
| 5,661,638 A | * | 8/1997 | Mira ......................... 361/697 |
| 5,704,416 A | 1/1998 | Larson et al. ......... 165/104.33 |
| 5,777,844 A | * | 7/1998 | Kiefer ........................ 361/704 |
| 5,785,116 A | 7/1998 | Wagner ...................... 165/80.3 |
| 5,794,685 A | 8/1998 | Dean ........................... 165/121 |
| 5,920,458 A | * | 7/1999 | Azar ........................... 361/704 |
| 5,975,194 A | 11/1999 | Wagner ...................... 165/80.3 |
| 6,075,702 A | 6/2000 | Gardner et al. ............. 361/704 |
| 6,152,214 A | 11/2000 | Wagner ...................... 165/121 |
| 6,176,299 B1 | 1/2001 | Hanzlik et al. ............ 165/80.3 |
| 6,189,601 B1 | 2/2001 | Goodman et al. ......... 165/80.3 |
| 6,208,511 B1 | 3/2001 | Bortolini et al. ............ 361/698 |
| 6,219,239 B1 | 4/2001 | Mellberg et al. ............ 361/704 |

FOREIGN PATENT DOCUMENTS

| EP | 1081760 | 3/2001 | ......... H01L/23/467 |
|---|---|---|---|
| JP | 6-77677 | 3/1994 | ............ H05K/7/20 |

* cited by examiner

Primary Examiner—David Nelms
Assistant Examiner—Tu-Tu Ho
(74) Attorney, Agent, or Firm—Schwegman, Lundberg, Woessner & Kluth, P.A.

(57) ABSTRACT

A heat dissipation system and method for extracting heat from an integrated circuit device includes a thermally conductive post having substantially planar upper and lower surfaces, wherein the upper surface is disposed across from the lower surface, and wherein the lower surface is adapted to contact an integrated circuit device. A conductive heat exchange portion including an array of fins extends upwardly from the upper surface of the post where possible to allow components mounted on a printed circuit board to be positioned around the integrated circuit device. The heat exchange portion including the array has a chamber within to receive and house an air movement device so that the air introduced around the fins by the air movement device enhances the heat dissipation from the heat dissipation device.

33 Claims, 7 Drawing Sheets

HIGH PERFORMANCE AIR COOLED HEAT SINKS USED IN HIGH DENSITY PACKAGING APPLICATIONS

TECHNICAL FIELD

This invention relates generally to a heat dissipation technique for an integrated circuit assembly, and more particularly to a technique for dissipating heat from an integrated circuit device.

BACKGROUND

Integrated circuit devices, microprocessors and other related computer components are becoming more and more powerful with increasing capabilities, resulting in increasing amounts of heat generated from these components. Packaged units and integrated circuit device sizes of these components are decreasing or remaining the same, but the amount of heat energy given off by these components per unit volume, mass, surface area or any other such metric is increasing. In current packaging techniques, heat sinks typically consist of a flat base plate, which is mounted to the integrated circuit device on one side. The heat sinks further include an array of fins running perpendicular to the flat base plate on the other side. Generally, the integrated circuit devices (which are the heat sources) have a significantly smaller footprint size than the flat base plate of the heat sink. The flat base plate of the heat sink has a large footprint, that is requires more motherboard real estate than the integrated circuit device in contact therewith. The larger size of the base plate causes the outermost part of the base plate that is not directly in contact with the integrated circuit device to have a significantly lower temperature than the part of the base plate that is directly in contact with the integrated circuit device. Furthermore, as computer-related equipment becomes more powerful, more components are being placed inside the equipment and on the motherboard which further requires more motherboard real estate. In addition, the base plate of prior art heat sink designs is at the same level as the integrated circuit device to which it is attached. Consequently, the flat base plate con/figuration of the heat sink generally ends up consuming more motherboard real estate than the integrated circuit device on which it is mounted. Also, the current design practice dictates that the fins extend to the edge of the flat base plate, and in order to grow the fins laterally, the flat base plate also has to grow. As a result, the larger footprint size of the base plate prevents other motherboard components, such as low-cost capacitors, from positioned around or on the microprocessor. Thus, the large amounts of heat produced by many of such integrated circuits, and the increasing demand for motherboard real estate need to be taken into consideration when designing the integrated circuit mounting and packaging devices.

For the reasons stated above, and for other reasons stated below which will become apparent to those skilled in the art upon reading and understanding the present specification, there is a need in the art for a low-mass enhanced heat dissipation device and method that has minimal lateral heat spreading resistance, and a high performance fin area above adjacent components. Also, there is a need for a heat dissipation device that do not consume more motherboard real estate than the integrated circuit device to which it is attached, to accommodate low-cost electronic components needing to be positioned around the microprocessor.

DETAILED DESCRIPTION

Figure 1:
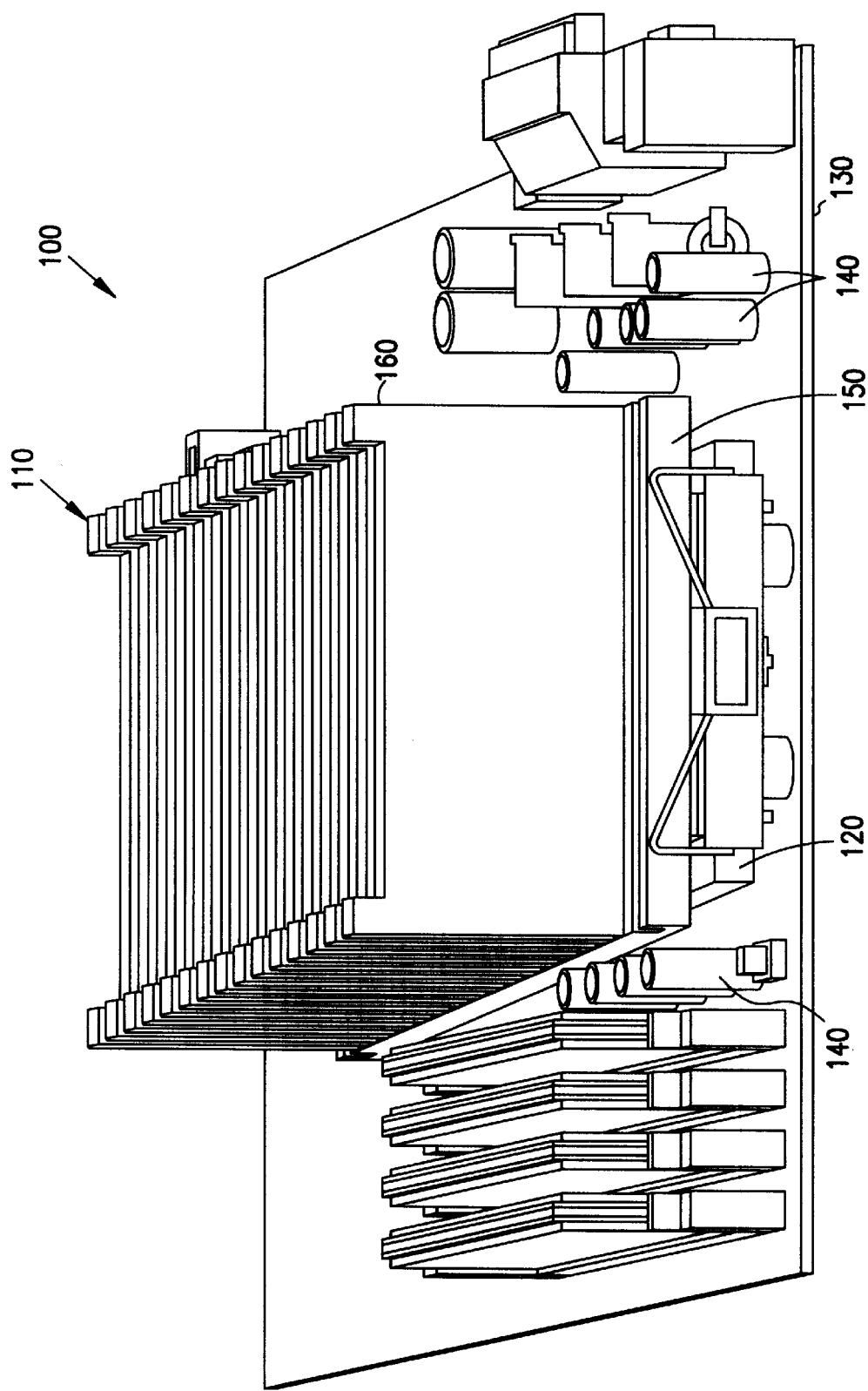
FIG. 1 is an isometric view of a prior art heat sink attached to a microprocessor mounted on an assembled printed circuit board.

In the following detailed description of the embodiments, reference is made to the accompanying drawings that illustrate the present invention and its practice. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included in other embodiments. The following detailed description is, therefore, not to be taken in a limiting sense, and the scope of the present invention is defined only by the appended claims, along with the full scope of equivalents to which such claims are entitled.

This document describes, among other things, an enhanced heat dissipation device including a chamber within to receive and house an air movement device that allows electronic components to be positioned around the microprocessor while maintaining high performance and cost effectiveness by leveraging currently enabled high-volume manufacturing techniques.

FIG. 1 shows an isometric view 100 of a prior art heat sink 110 mounted on a microprocessor 120 of an assembled mother board 130. Also, shown in FIG. 1 are low-cost capacitors 140 mounted around the heat sink 110 and on the mother board 130.

The prior art heat sink 100 has a flat base plate 150 including an array of fins 160 extending perpendicularly away from the flat base plate 150. This configuration of the heat sink 110 dictates the use of the flat base plate 150, with the array of fins 160 for dissipating heat from the microprocessor 120. Increasing the heat dissipation using the prior art heat sink 110 shown in FIG. 1 generally requires enlarging the surface area of the flat base plate 150 and/or the array of fins 160. This in turn results in consuming more motherboard real estate. Generally, the microprocessor 120 (which is the heat source) has a smaller footprint size than the flat base plate 150 configuration of the heat sink 110 shown in FIG. 1. A larger footprint size of the flat base plate 150 can cause the outermost part of the flat base plate 150 (the portion that is not directly in contact with the integrated circuit device) to have a significantly lower temperature than the part of the flat base plate 150 that is directly in contact with the integrated circuit device. Consequently, the prior art heat sink 110 with the larger flat base plate 150 is not effective in dissipating heat from the integrated circuit device. Furthermore, the packaged units and integrated circuit device sizes are decreasing, while the amount of heat generated by these components is increasing. The prior art heat sink 110 configuration dictates that the array of fins 160 extend to the edge of the flat base plate 150 to extract heat from the integrated circuit device. Also, the prior art heat sink 110 requires increasing the size of the array of fins 160 to increase the heat dissipation. In order to enlarge the fins 120 laterally, the flat base plate 150 has to increase in size. Enlarging the flat base plate 150 consumes more motherboard real estate. Consuming more motherboard real estate is generally not a viable option in an environment where system packaging densities are increasing with each successive, higher performance, integrated circuit device generation. Also, the flat base plate 150 configuration of the prior art heat sink 100 has a larger footprint size than the integrated circuit device on which it is mounted (the flat base plate 110 is at the same level as the integrated circuit device it is mounted on). The larger foot print size of the flat base plate 150 prevents motherboard components, such as low-cost capacitors, from positioned on and around the integrated circuit device.

Figure 2:
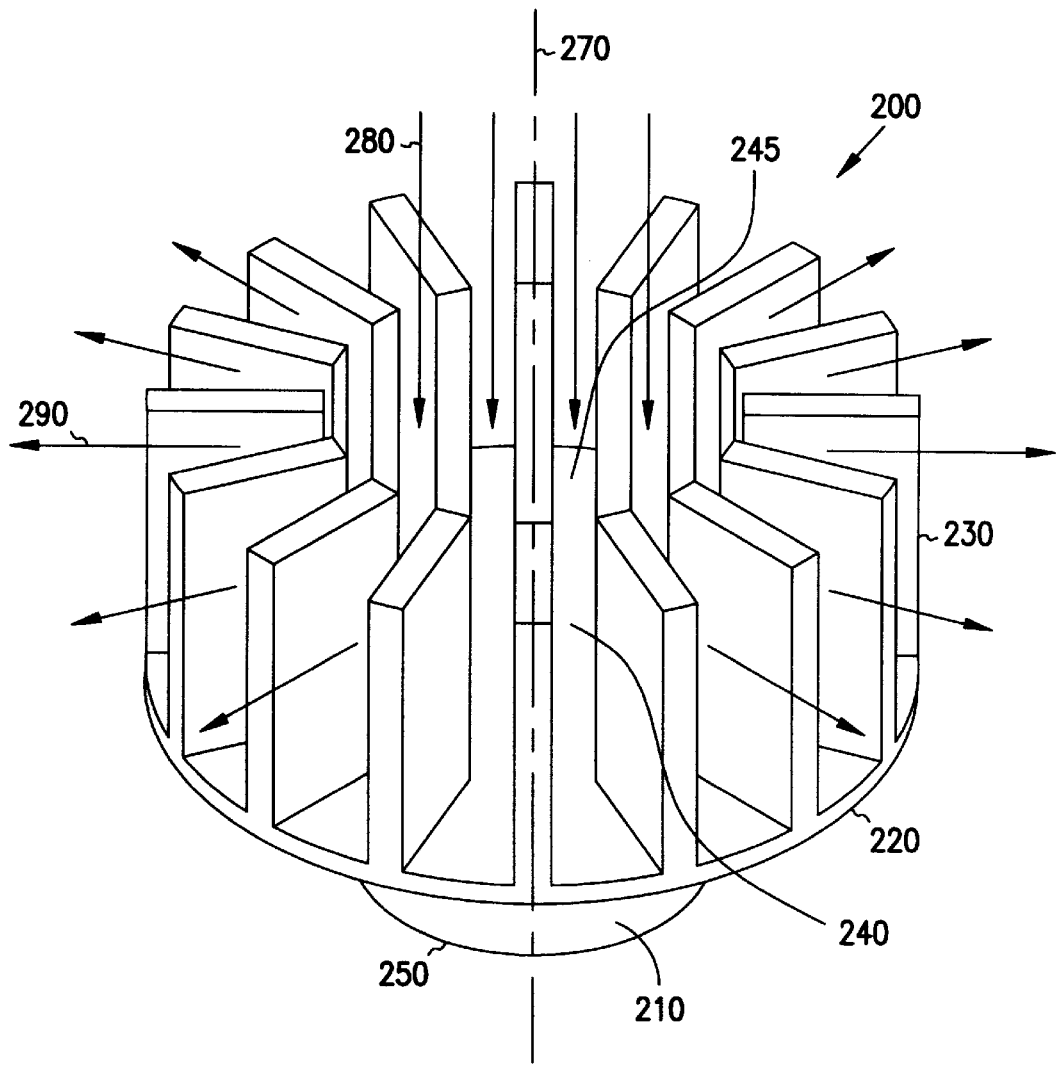
FIG. 2 is an isometric view of another embodiment of a heat dissipation device according to the present invention.

FIG. 2 is an isometric view of the heat dissipation device 200 according to one embodiment of the present invention. The heat dissipation device 200 shown in FIG. 2 includes a thermally conductive post 210, and a conductive heat exchange portion 220. In some embodiments, the conductive heat exchange portion 220 includes an array of fins 230. The thermally conductive post 210 has substantially planar upper and lower surfaces 240 and 250. The upper surface 240 is disposed across from the lower surface 250. The lower surface 250 is adapted to contact an integrated circuit device. The post 210 has an axis 270. The upper and lower surfaces 240 and 250 can be substantially perpendicular to the axis 270.

The conductive heat exchange portion 220 including the array of fins 230 extends upwardly from the upper surface 240 of the post 210 where possible to allow components mounted on a printed circuit board to be positioned around the integrated circuit device. The heat exchange portion 220 including the array 230 further has a chamber 245 within to receive and house an air movement device such as a fan to enhance heat dissipation from the integrated circuit device by drawing a cooling medium such as air 280 into the chamber 245 and pushing the air around, over, and through 290 the array of fins 230.

The upwardly extending heat exchange portion 220 and the array 230 overhangs the post 210 to allow the components to be positioned around the integrated circuit device. Also, the post 210 including the upwardly extending heat exchange portion 220 and the array 230 are of sufficient size so that they do not mechanically interfere with the components needing to be placed around the integrated circuit device. In some embodiments, the post 210 and the heat exchange portion 220 are constructed and arranged for coupling the post to the integrated circuit device without interference between the heat exchange portion 220 and other components mounted on the printed circuit board. In some embodiments, the heat exchange portion 220 including the array 230 extend such that the extended heat exchange portion overhangs over the components positioned around the integrated circuit device. The upwardly extending heat exchange portion 220 and the array 230 can have outer shapes such as circular, square, rectangular, elliptical, and/or any other shape suitable for dissipating heat from the integrated circuit device. The heat dissipation device 200 can be made from materials such as copper, aluminum, and/or other such materials suitable for dissipating heat from the integrated circuit device. The integrated circuit device can be a microprocessor, digital signal processor, and/or an application-specific integrated circuit.

Figure 3:
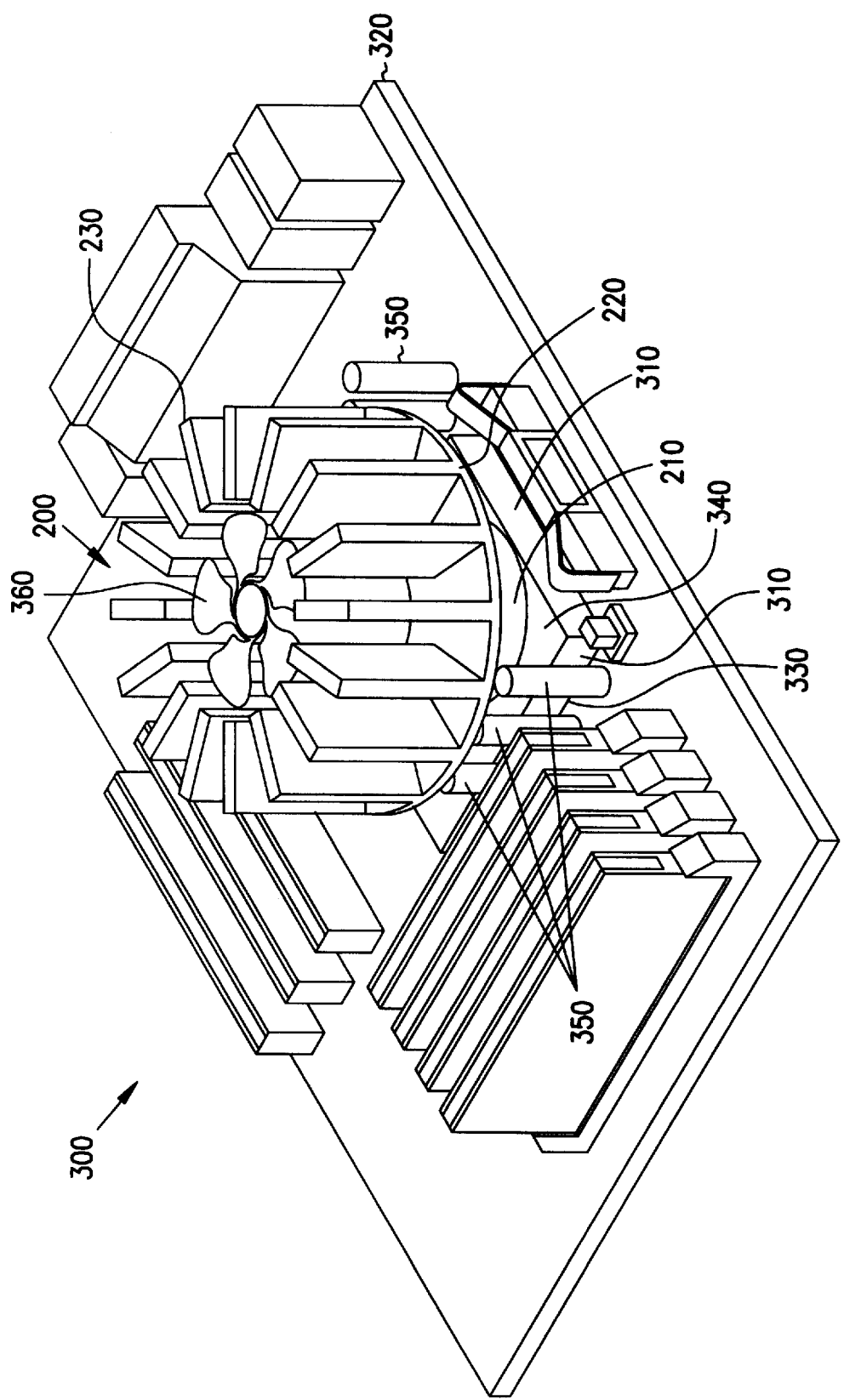
FIG. 3 is an isometric view of the heat dissipation device shown in FIG. 2 attached to a microprocessor mounted onto an assembled printed circuit board.

FIG. 3 is an isometric view of an electronic system 300 showing the enhanced heat dissipation device 200 shown in FIG. 2, attached to a microprocessor 310 on an assembled motherboard 320. In the example embodiment shown in FIG. 3, the microprocessor 310 has front and back sides 330 and 340. The front side 330 is disposed opposite the back side 340. The front side 330 is attached to the motherboard 320 including components such as low-cost capacitors 350 and other such electrical components. The lower surface 250 shown in FIG. 2, of the enhanced heat dissipation device 200, is attached to the back side 340 of the microprocessor 310. It can be seen from FIG. 3 that the heat exchange portion 220 and the array 230 extend upwardly such that they are of sufficient size and shape to allow low-cost capacitors 350 mounted on the motherboard 320 to be positioned around the microprocessor 310. It can also be seen that the low-cost capacitors 350 are below the heat exchange portion 220 and the array 230 and around the post 210.

It can also be envisioned that the size of the lower surface 250 of the post 210 to be the same as the back side 340 of the microprocessor to maximize the heat dissipation characteristics of the heat dissipation device 200. Also, it can be seen in FIG. 3 that the heat exchange portion 220 including the array 230 is larger than the post 210, thereby increasing the heat dissipation rate without increasing a footprint size of the post 210 of the heat dissipation device 200 any more than the back side 340 of the microprocessor 310. The coinciding footprint sizes of the post 210 and back side 340 of the microprocessor 310 enables the post 210 and the back side 340 of the microprocessor 310 to have the same heat transfer rates. This in turn can significantly increase the heat transfer efficiency between the post 210 and the back side 340 of the microprocessor 310. The heat transfer rate between the post 210 and the back side 340 of the microprocessor can be further increased by thermally coupling the post 210 to the back side 340 using a layer of thermal grease, and/or a layer of thermally conductive adhesive material. Also, shown in FIG. 3 is an air movement device such as a fan 360 disposed within the chamber 245 to increase the heat dissipation rate from the heat dissipation device 200.

Figure 4:
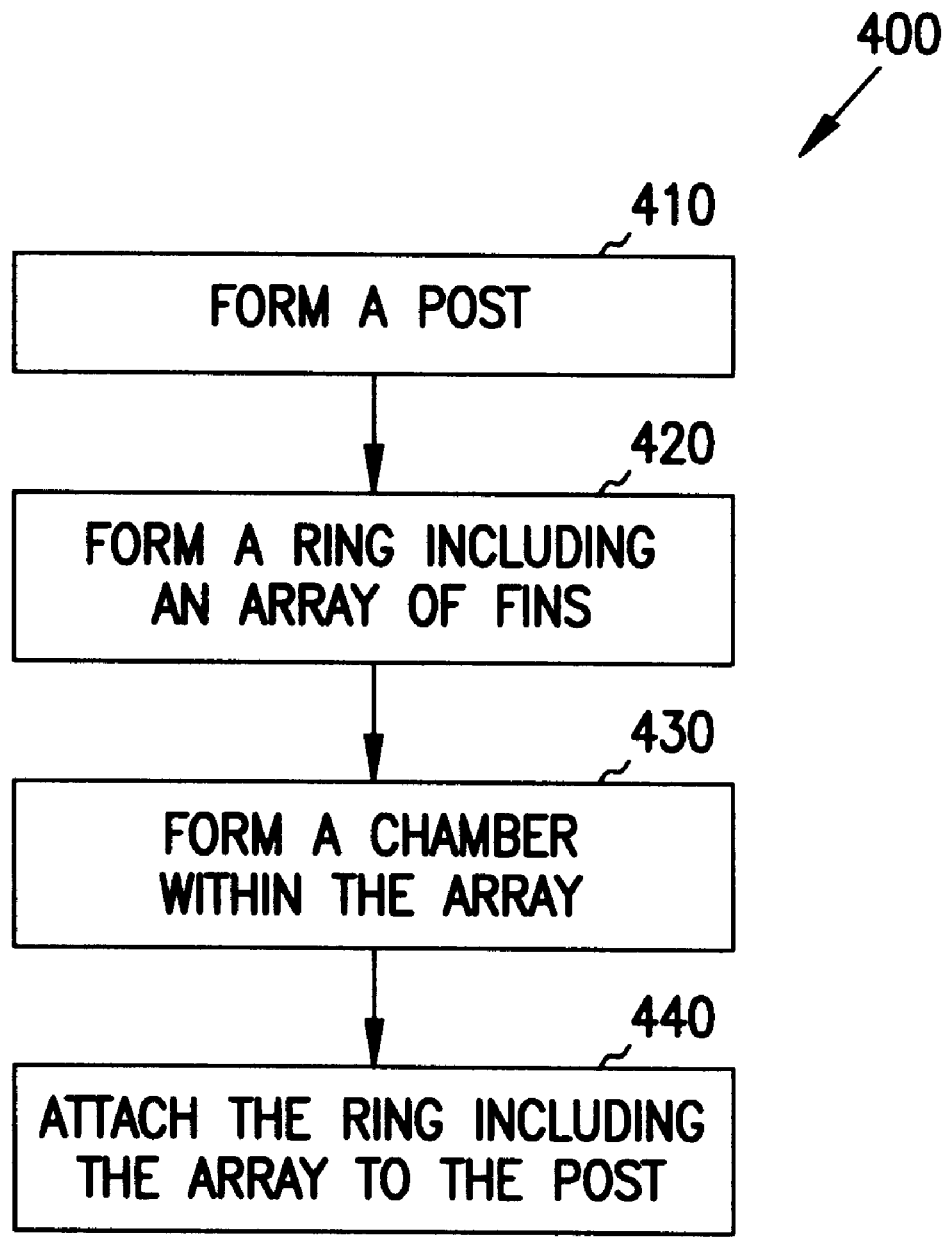
FIG. 4 is a flow diagram of one exemplary method of forming the heat dissipation device according to the present invention.

FIG. 4 is a flow diagram illustrating one example method 400 of forming the heat dissipation device 200 shown in FIG. 2 to extract heat from an integrated circuit device such that the heat dissipation device 200 can allow components to be positioned around the integrated circuit device. Method 400 as shown in FIG. 4, begins with action 410 of forming a thermally conductive post including substantially planar upper and lower surfaces. The lower surface is adapted to contact the integrated circuit device. The upper surface is across from the lower surface. The formed post can be a pedestal. The integrated circuit device can include devices such as a microprocessor, a digital signal processor, and/or an application-specific integrated circuit.

The next action 420 in the method 400 includes forming a heat exchange portion including an array of fins such that the heat exchange portion and the array has a through hole large enough to receive and hold the formed post in place. In some embodiments, the heat exchange portion including the array and the through hole are formed using an extrusion process in one single operation. In some embodiments, the through hole can be formed after forming the heat exchange portion and the array by a boring or drilling operation. In some embodiments, the through hole is formed substantially in the middle of the heat exchange portion. The through hole has an axis that runs substantially parallel to the array. Further, the axis runs substantially in the center of the through hole. In some embodiments, the formed array extends upwardly in configurations such as straight, circular, semi-circular, and/or other such configurations suitable for dissipating heat from the integrated circuit device. In some embodiments, the heat exchange portion including the array are formed to have outer shapes that are circular, square, rectangular, elliptical, and/or other such shapes suitable for forming and dissipating heat from the integrated circuit device.

The next action 430 includes forming a chamber within the heat exchange portion, the array, and the through hole. The chamber is sized to receive and house an air movement device such that air introduced by the air movement device enhances the heat dissipation from the heat dissipation device. In some embodiments, the chamber is formed using a boring operation. The chamber can be substantially concentric with the through hole. The air movement device can be a fan.

The next action 440 includes thermally coupling the heat exchange portion to the post. In some embodiments, the upper surface of the post is thermally coupled to the through hole. In some embodiments, this is accomplished by further boring the extruded through hole so that a mechanical interference fit can be achieved between the through hole and the post when the upper surface of the post is inserted into the bored through hole. In some embodiments, the post and heat exchange portion are thermally coupled using a thermally conductive adhesive, and/or any other suitable material that can provide the desired thermal coupling between the post and the heat exchange portion. The heat dissipating device can be formed from materials such as copper, aluminum, and/or other such materials suitable for dissipating heat from the integrated circuit device. In some embodiments, the post is thermally coupled to the heat exchange portion including the array such that the heat exchange portion overhangs the post to allow components to be positioned around the integrated circuit device when the heat dissipation device is mounted on to the integrated circuit device.

Figure 5:
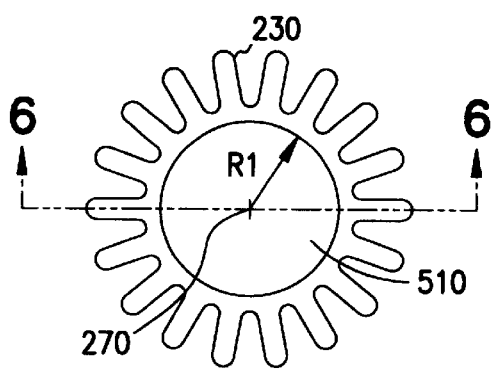
FIGS. 5, 6, 7, 8 and 9 illustrate one example embodiment of forming the heat dissipation device shown in FIG. 2 using an extrusion process.
Figure 7:
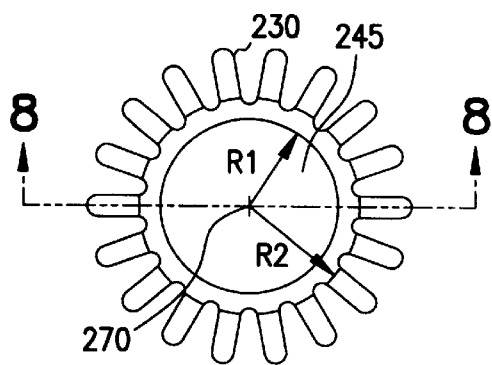
Figure 6:
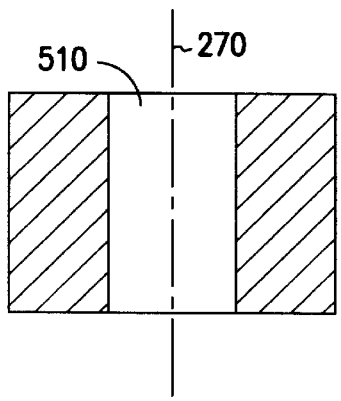
Figure 8:
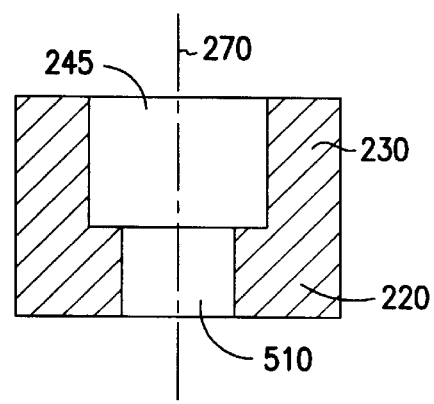
Figure 9:
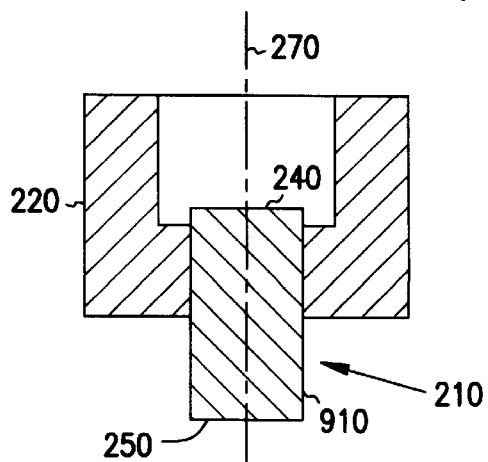

FIGS. 5, 6, 7, 8 and 9 illustrate one example embodiment of forming the heat dissipation device shown in FIG. 2. FIGS. 5 and 6 show forming the array of fins 230 with the through hole 510 having a radius $R_1$ from a blank using an extrusion process. FIGS. 7 and 8 show the forming of a heat exchange portion 220 and the chamber 245 having radius $R_2$ within the heat exchange portion 220 and the array 230 using a boring operation. FIG. 9 illustrates thermally coupling the post 210 and heat exchange portion 220 using the through hole 510 in the heat exchange portion 220 such that the upper surface 240 of the post is in close proximity to the chamber 245. In some embodiments, the formed chamber 245 and the through hole 510 are concentric to the axis 270. In some embodiments, the chamber 245 and the through hole 510 are 25 substantially in the middle of the heat exchange portion 220 and the post 210, respectively.

Figure 10:
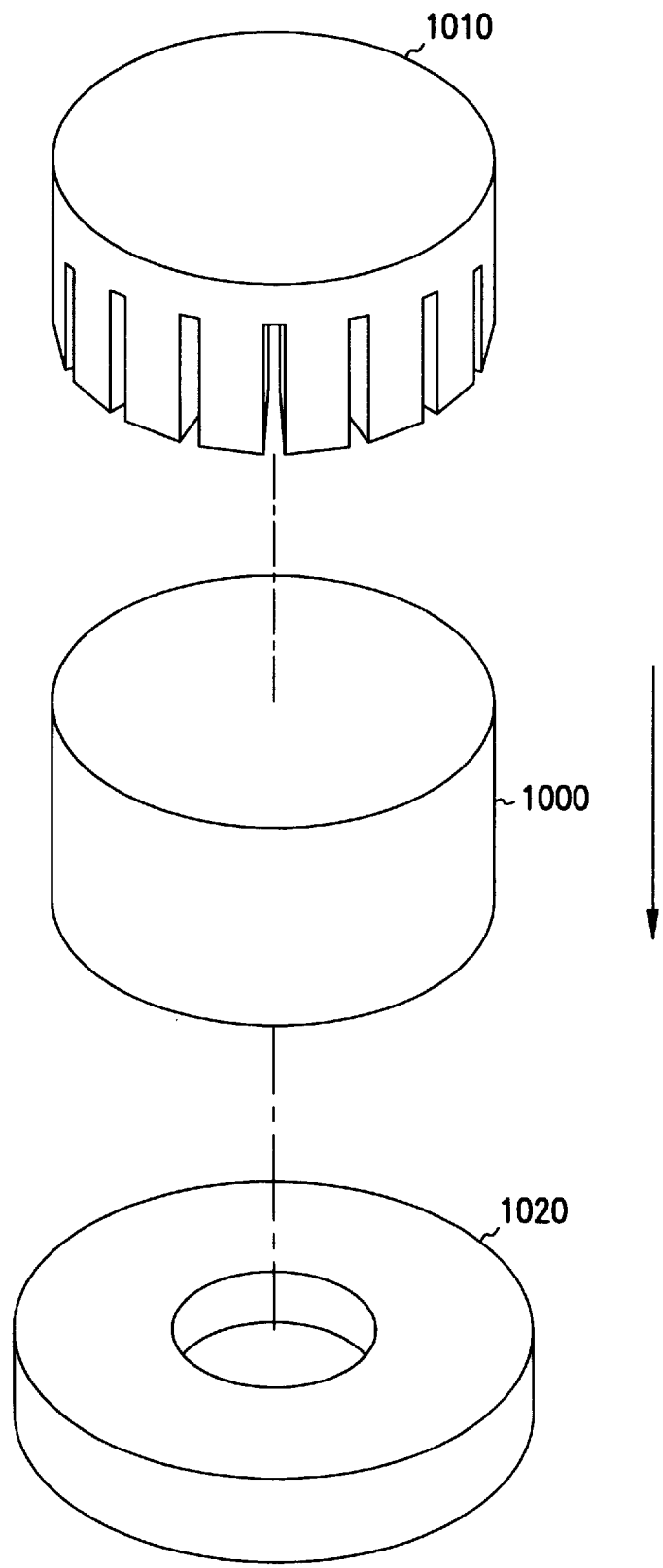
FIGS. 10 and 11 illustrate another example embodiment of forming the heat dissipation device shown in FIG. 2 using an impact extrusion technique.
Figure 11:
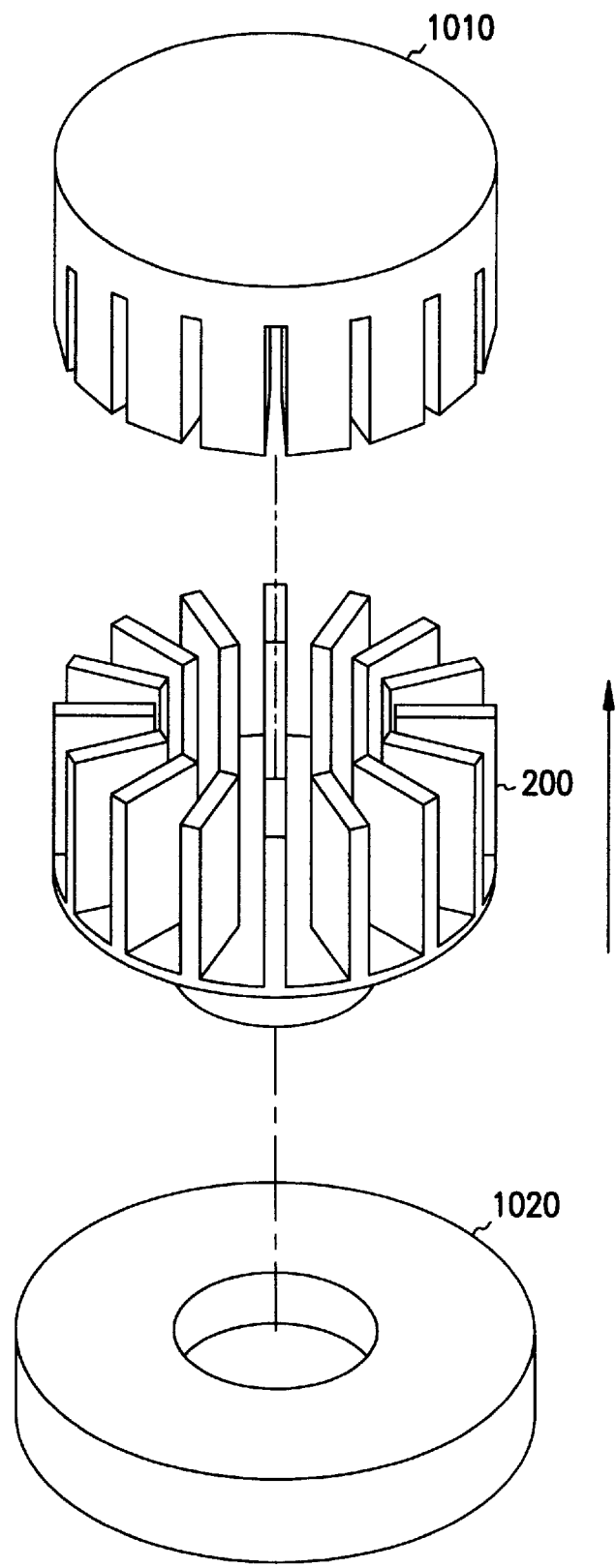

FIGS. 10 and 11 illustrate another example embodiment of forming the heat dissipation device 200 shown in FIG. 2 using an impact extrusion process. FIG. 10 shows the forming of the heat dissipation device 200 by striking a cold metal slug 1000 between two confronting dies 1010 and 1020 having cavity regions corresponding to the spacings, alignments, height, and width of the heat dissipation device 200 shown in FIG. 2. Impact extrusion is a forming process that produces finished work pieces by striking the metal slug 1000 contained between two confronting die cavities 1010 and 1020. During the impact extrusion process, the metal slug 1000 is forced to flow between the confronting die cavities 1010 and 1020 by a single high speed blow. Impact extrusion is also referred to as micro forging is generally a cold forging technique. The impact extrusion process permits the mass production of parts with a precision and ultra-fine detail generally not attainable with the conventional extrusion and forging processes. Impact extrusion generally produces a finished part that does not require any subsequent machining operations. The finish produced by impact extrusion generally has a high resistance to corrosion. Also, impact extrusion produces a homogeneous and undistorted grain and microstructure in the finished part. FIG. 11 shows the formed heat dissipation device 200 after completing the single high speed blow between the two die cavities 1010 and 1020.

Conclusion

The above-described method and device provides, among other things, an enhanced heat dissipation device having fins including a chamber within extends outwardly upwardly from a thermally conductive post where possible, to allow electronic components to be positioned around the microprocessor while maintaining high performance and cost effectiveness by leveraging currently enabled high-volume manufacturing techniques.

What is claimed is:

1. A heat dissipation device for dissipating heat from an integrated circuit device mounted on a printed circuit board surrounded by other components, comprising:

a thermally conductive post having substantially planar upper and lower surfaces, wherein the lower surface is adapted to contact the integrated circuit device; and a thermally conductive heat exchange portion extending upwardly from the upper surface of the post, the post and the heat exchange portion are constructed and arranged for coupling the post to the integrated circuit device such that the heat exchange portion, the post, and the integrated circuit device are in close proximity without interference with the components mounted on the printed circuit board, the heat exchange portion has a chamber within to house an air movement device constructed and arranged for circulating air over the fins to enhance the heat dissipation from the heat dissipation device.

2. The device of claim 1, wherein the conductive heat exchange portion includes an array of fins.

3. The device of claim 2, wherein the upper surface is disposed across from the lower surface, and wherein the conductive heat exchange portion including the array extends upwardly from the upper surface of the post comprises:

the upwardly extending heat exchange portion including the array overhangs the post to allow the components to be positioned around the integrated circuit device.

4. The device of claim 3, wherein the post and the upwardly extending heat exchange portion including the array are of sufficient size so that they do not mechanically interfere with the components needing to be placed around the integrated circuit device.

5. The device of claim 3, wherein the heat dissipation device has an outer shape selected from the group consisting of circular, square, rectangular, elliptical, and other such shapes suitable for a heat sink.

6. The device of claim 5, wherein the heat exchange portion including the array extends upwardly from the upper surface comprises:

the heat exchange portion including the array extends upwardly such that the extended heat exchange portion overhangs over the components positioned around the integrated circuit device.

7. The device of claim 1, wherein the heat dissipation device is made from a material selected from the group consisting of copper, aluminum, and other such materials suitable for dissipating heat away from the integrated circuit device.

8. The device of claim 1, wherein the integrated circuit device is a microprocessor.

9. The device of claim 1, wherein the integrated circuit device is a digital signal processor.

10. The device of claim 1, wherein the integrated circuit device comprises an application-specific integrated circuit.

11. The device of claim 1, wherein the air movement device comprises a fan.

12. The device of claim 1, wherein the heat exchange portion including the array is thermally coupled to the upper surface of the post.

13. An electronic system, comprising:

a printed circuit board having at least one integrated circuit device, wherein the integrated circuit device having a front side and a back side, and wherein the front side is mounted to the printed circuit board;

a heat dissipation device comprising:

a thermally conductive post, having substantially planar upper and lower surfaces, wherein the lower surface has a shape substantially similar to the back side of the integrated circuit device, wherein the lower surface is thermally coupled to the back side of the integrated circuit device; and a conductive heat exchange portion extends upwardly from the upper surface of the post such that the heat exchange portion and the post allow clearance for components mounted on the printed circuit board to be in close proximity to the integrated circuit device, the heat exchange portion has a chamber within to receive an air movement device constructed and arranged for moving air in, around, over, and out the chamber to enhance heat dissipation from the heat dissipation device.

14. The system of claim 13, wherein the integrated circuit device is a microprocessor.

15. The system of claim 13, wherein the air movement device is a fan, wherein the fan is disposed within the chamber to enhance heat dissipation from the heat dissipation device.

16. The system of claim 13, wherein the heat dissipation device is made from a material selected from the group consisting of copper, aluminum, and other such materials suitable for dissipating heat away from the integrated circuit device.

17. A method of forming a heat dissipation device to extract heat from an integrated circuit device attached to a printed circuit board surrounded by other components, comprising:

forming a thermally conductive post including a substantially planar surface adapted to contact the integrated circuit device, and a heat exchange portion having a chamber within to receive an air movement device such that the air movement over the array enhances the heat dissipation from the device, and further the heat exchange portion including the array extends upwardly from the post such that the integrated circuit device, the post, and the heat exchange portion including the array are in close proximity and do not interfere with the other components mounted on the printed circuit board.

18. The method of claim 17, wherein forming the thermally conductive post including the heat exchange portion and the array comprises:

forming the thermally conductive post including the heat exchange portion and the array using an impact extrusion process.

19. The method of claim 18, wherein forming the heat exchange portion including the array comprises:

forming the heat exchange portion including the array such that the heat exchange portion including the array overhangs the post to allow the components to be positioned around the integrated circuit device.

20. The method of claim 19, wherein forming the heat dissipation device comprises:

forming the heat dissipation device such that the heat dissipation device has an outer shape selected from the group consisting of circular, square, rectangular, elliptical, and other such shapes suitable for a heat sink.

21. The method of claim 20, wherein the heat dissipation device is made from a material selected from the group consisting of copper, aluminum, and/or other such materials suitable for dissipating heat away from the integrated circuit device.

22. The method of claim 17, wherein the integrated circuit device is a microprocessor.

23. A method of forming a heat dissipation device to extract heat from an integrated circuit device attached to a printed circuit board surrounded by other components, comprising:

forming a thermally conductive post including substantially planar upper and lower surfaces, wherein the upper surface is disposed across from the lower surface, wherein the lower surface is adapted to thermally contact the integrated circuit device;

forming a heat exchange portion including an array of fins and a through hole substantially in the middle of the heat exchange portion and wherein the through hole has an axis that is substantially parallel to the array of fins;

forming a chamber within the heat exchange portion including the array and the through hole to receive and house an air movement device so that the air movement created by the air movement device enhances the heat dissipation from the device; and thermally coupling the post to the through hole in the heat exchange portion such that the upper surface of the post is in close proximity to the chamber and further the heat exchange portion including the array extends upwardly from the upper surface of the post such that the integrated circuit device and the post including the array are in close proximity and do not interfere with the other components mounted on the printed circuit board.

24. The method of claim 23, wherein forming the heat exchange portion including the array and the through hole comprises:

forming the heat exchange portion including the array and the through hole using an extrusion process.

25. The method of claim 24, wherein forming the chamber within the heat exchange portion comprises:

forming the chamber within the heat exchange portion using a boring operation.

26. The method of claim 25, wherein forming the heat exchange portion including the array comprises:

forming the heat exchange portion including the array such that the heat exchange portion including the array overhangs the post to allow the components to be positioned around the integrated circuit device.

27. The method of claim 26, wherein forming the radially and upwardly extending array comprises:

forming the array such that the array of fins extend upwardly in configurations selected from the group consisting of straight, circular, semi circular, and other such configurations suitable for dissipating heat from the integrated circuit device.

28. The method of claim 27, wherein forming the heat dissipation device comprises:

forming the heat dissipation device such that the heat dissipation device has an outer shape selected from the group consisting of circular, square, rectangular, elliptical, and other such shapes suitable for a heat sink.

29. The method of claim 28, wherein the heat dissipation device is made from a material selected from the group consisting of copper, aluminum, and/or other such materials suitable for dissipating heat away from the integrated circuit device.

30. The method of claim 23, wherein the integrated circuit device is a microprocessor.

31. The method of claim 23, wherein the integrated circuit device is a digital signal processor.

32. The method of claim 23, wherein the air movement device is a fan.

33. The method of claim 23, wherein the post is a pedestal.

* * * * *

UNITED STATES PATENT AND TRADEMARK OFFICE
CERTIFICATE OF CORRECTION

PATENT NO.   : 6,479,895 B1
DATED        : November 12, 2002
INVENTOR(S)  : Seri Lee, Lloyd L. Pollard, II and Craig M. Randleman It is certified that error appears in the above-identified patent and that said Letters Patent is hereby corrected as shown below:

Column 1,
Line 27, delete "is" before "requires".
Line 39, delete "con/figuration" and insert -- configuration --, therefor.

Column 2,
Line 45, delete "mother board" and insert -- motherboard --, therefor.
Line 47, delete "mother board" and insert -- motherboard --, therefor.

Signed and Sealed this

Fourth Day of March, 2003

JAMES E. ROGAN
*Director of the United States Patent and Trademark Office*